US007019816B2

(12) United States Patent
Ottens et al.

(10) Patent No.: US 7,019,816 B2
(45) Date of Patent: Mar. 28, 2006

(54) LITHOGRAPHIC APPARATUS, DEVICE MANUFACTURING METHOD, AND DEVICE MANUFACTURED THEREBY

(75) Inventors: Joost Jeroen Ottens, Vedlhoven (NL); Henrikus Herman Marie Cox, Eindhoven (NL); Koen Jacobus Johannes Maria Zaal, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/736,988

(22) Filed: Dec. 17, 2003

(65) Prior Publication Data

US 2005/0134829 A1 Jun. 23, 2005

(51) Int. Cl.
*G03B 27/58* (2006.01)
*G03B 27/62* (2006.01)

(52) U.S. Cl. .......................................... 355/72; 355/75

(58) Field of Classification Search ............ 355/72–76, 355/53; 378/34, 35; 310/10, 12; 361/234
See application file for complete search history.

(56) References Cited

U.S. PATENT DOCUMENTS

| | | | | |
|---|---|---|---|---|
| 4,666,291 | A * | 5/1987 | Taniguchi et al. | 355/52 |
| 4,737,824 | A * | 4/1988 | Sakai et al. | 355/53 |
| 5,724,121 | A * | 3/1998 | McKinley et al. | 355/53 |
| 6,135,858 | A * | 10/2000 | Takahashi | 451/41 |
| 6,529,266 | B1 * | 3/2003 | Sandstrom | 355/72 |
| 6,710,857 | B1 * | 3/2004 | Kondo | 355/72 |
| 6,760,094 | B1 * | 7/2004 | Shimada | 355/53 |
| 2004/0080734 | A1 * | 4/2004 | Taniguchi et al. | 355/53 |

FOREIGN PATENT DOCUMENTS

EP 0 947 884 A2 10/1999

* cited by examiner

*Primary Examiner*—Henry Hung Nguyen
(74) *Attorney, Agent, or Firm*—Pillsbury Winthrop Shaw Pittman LLP

(57) ABSTRACT

A lithographic apparatus is disclosed. The apparatus includes an illumination system to provide a beam of radiation, an article support to support an article to be placed in a beam path of the beam of radiation, and a clamp to clamp the article to the article support. The clamp is provided with a plurality of zones located around a circumference of the article support to create a locally adjusted pressure so as to provide a local bending moment to locally bend the article.

13 Claims, 7 Drawing Sheets

LITHOGRAPHIC APPARATUS, DEVICE MANUFACTURING METHOD, AND DEVICE MANUFACTURED THEREBY

BACKGROUND OF THE INVENTION

1. Field of the Invention

The present invention relates generally to a lithographic apparatus. More specifically, the present invention relates to an article support of a lithographic apparatus.

2. Description of Related Art

A lithographic apparatus is a machine that applies a desired pattern onto a target portion of a substrate. Lithographic apparatus can be used, for example, in the manufacture of integrated circuits (ICs). In that circumstance, a patterning means, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

In the conventional lithographic projection apparatus, during lithographic processes, an article, such as a wafer or reticle, is clamped on an article support by a clamping force, that may range from vacuum pressure forces, electrostatic forces, intermolecular binding forces or just gravity force. In the context of this application, the "article" may be any of the above mentioned terms of wafer, reticle, mask, or substrate, more specifically terms such as a substrate to be processed in manufacturing devices employing lithographic projection techniques; or a lithographic projection mask or mask blank in a lithographic projection apparatus, a mask handling apparatus such as mask inspection or cleaning apparatus, or a mask manufacturing apparatus or any other article or optical element that is clamped in the light path of the radiation system.

European patent application EP0947884 describes a lithographic apparatus having an article holder wherein protrusions are arranged to improve the flatness of the article. These protrusions have a general diameter of 0.5 mm and are located generally at a distance of 3 mm away from each other and thereby form a bed of supporting members that support the article. However, such a configuration is costly to manufacture, since the protrusions need to be perfectly level. In this respect, it is desirable to reduce the number of protrusions of the article. However, when reducing the number of protrusions, the article tends to be supported more unevenly, which may result in image degradation and loss of resolution. A further problem is that in most cases, the article is not perfectly level, so that leveling thereof requires a large support area that is perfectly level, and the use of a relatively high clamping pressure.

SUMMARY OF THE INVENTION

One aspect of embodiments of the invention is to provide a lithographic projection apparatus comprising: an illumination system for providing a projection beam of radiation; an article support for supporting a flat article to be placed in a beam path of the projection beam of radiation on the article support; and a clamp for clamping the article to the article support, wherein the number of supporting protrusions is reduced and wherein an article is leveled in a controllable way.

Another aspect of embodiments of the invention is to provide a lithographic apparatus that includes an illumination system to provide a beam of radiation; an article support to support an article to be placed in a beam path of said beam of radiation; and a clamp to clamp the article to the article support. The clamp is provided with a plurality of zones located around a circumference of the article support to create a locally adjusted pressure so as to provide a local bending moment to locally bend said article.

Another aspect of embodiments of the invention is to provide an article holder that includes a clamp that is provided with a plurality of clamping zones located around a circumference of the article support. In this way, a locally adjusted pressure can be created for providing a local bending moment for locally bending the article. Hence, a non-flat article may be rendered flat by creating bending moments on the side of the article.

In a preferred embodiment, the article support comprises at least three support pillars, or, more specifically, only three or four support pillars. In such an embodiment, the article is relatively insensitive for variations in altitude due to the presence of particle dust on any of the pillars. Such presence amounts to a relative tilt of the article, which can easily be accounted for.

In a further preferred embodiment, the support pillars are actuable, for instance, by comprising piezo-pads. Such an embodiment has as an advantage that a local area can be pushed relative to a neighboring area, so that undesired depressions of the article surface may be rendered level.

Alternatively, or in addition, at least some of the plurality of zones each comprise an individually controllable electrostatic clamp. Such an embodiment has as a benefit that it comprises zones for pulling and zones for pushing the article, so that a specific layout may be rendered flat. It follows, that with relatively few contact points, as few as even three, the article may be kept flat using such alternatively pulling and pushing zones. In this respect, by "pulling", a downward pressure is developed on the article, to clamp the article on the article support. By "pushing", an upward pressure is developed, for (locally) pushing the article from the article support.

Furthermore, the clamp may comprise a height sensor for sensing a local height of the article. In particular, for an electrostatic clamp, height sensing circuitry may be coupled to a capacitive plate of the clamp. In addition, the height sensing circuitry may be coupled to a clamp control unit for adjusting the clamping pressure of the electrostatic clamp to attain a leveled article. Moreover, the clamp control unit may control the clamping pressure in response to a detected local height of the article and/or a detected image quality. In another preferred embodiment, the plurality of zones comprise sectioned pressure zones for creating a relatively differing backfill gas pressure. By such compartmented zones, relatively differing pressures can be developed to generate a local pushing zone.

Another aspect of embodiments of the invention is to provide a device manufacturing method. The method includes providing a beam of radiation, patterning the beam of radiation, projecting the patterned beam of radiation onto a target portion of a later of radiation-sensitive material using a projection system, clamping an article to be placed in a beam path of the beam of radiation, and adjusting at least one clamping pressure to attain a leveled article. A further aspect of embodiments of the invention is to provide a device manufactured according to the device manufacturing method.

Yet another aspect of embodiments of the invention is to provide a method of supporting a reticle. The method includes placing a reticle on a reticle support, determining at least one of an uneveness, unflatness, and tilting of the reticle on the support, and applying pressure to the reticle to bend the reticle to correct the at least one of the uneveness, unflatness, and tilting of the reticle.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example, in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "patterning device" or "patterning structure" used herein should be broadly interpreted as referring to a device or structure that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. In this manner, the reflected beam is patterned. In each example of the patterning device, the support structure may be a frame or table, for example, which may be fixed or movable as required and which may ensure that the patterning device is at a desired position, for example, with respect to the projection system. Any use of the terms "reticle" or "mask" herein may be considered synonymous with the more general term "patterning device".

The term "projection system" used herein should be broadly interpreted as encompassing various types of projection systems, including refractive optical systems, reflective optical systems, and catadioptric optical systems, as appropriate, for example, for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines, the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

In the drawings, like or corresponding elements are referenced by the same reference numerals. For clarity of understanding, in some cases, only a few signal elements are indicated graphically, and/or only a few of them are referenced by reference numerals.

DETAILED DESCRIPTION OF EMBODIMENTS OF THE INVENTION

Figure 1:
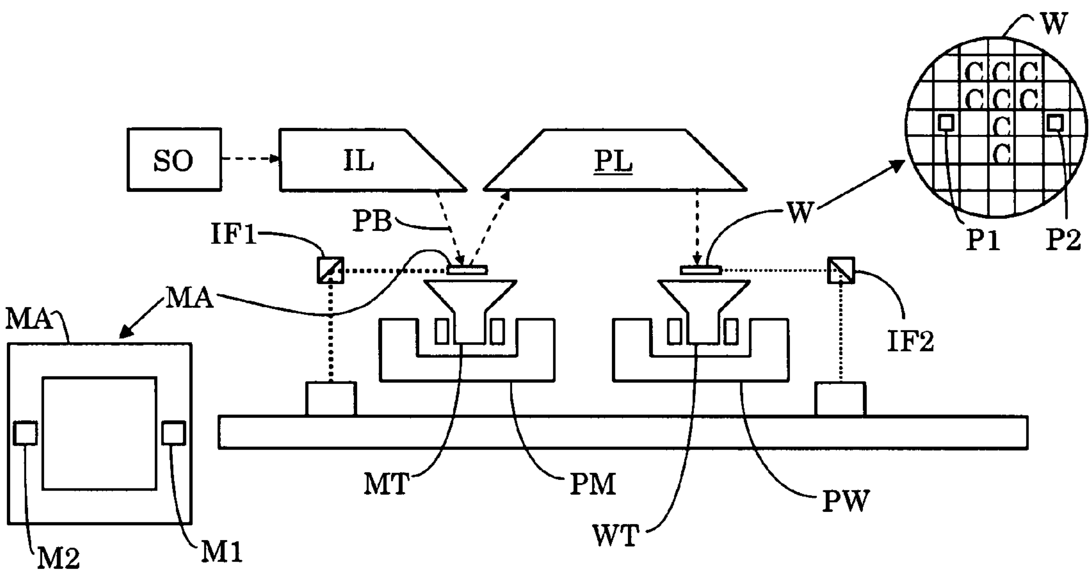
FIG. 1 depicts a lithographic projection apparatus according to an embodiment of the invention.

FIG. 1 schematically depicts a lithographic apparatus according to a particular embodiment of the invention. The apparatus comprises: an illumination system (illuminator) IL for providing a projection beam PB of radiation (e.g. UV or EUV radiation); a first support structure (e.g. a mask table) MT for supporting a patterning structure (e.g. a mask) MA and connected to a first positioning device PM for accurately positioning the patterning structure with respect to item PL; a second support structure (e.g. a substrate table or a wafer table) WT for holding a substrate (e.g. a resist-coated wafer) W and connected to a second positioning device PW for accurately positioning the substrate with respect to item PL; and a projection system (e.g. a reflective projection lens) PL for imaging a pattern imparted to the projection beam PB by the patterning structure MA onto a target portion C (e.g. comprising one or more dies) of the substrate W.

As here depicted, the apparatus is of a reflective type (e.g. employing a reflective mask or a programmable mirror array of a type as referred to above). Alternatively, the apparatus may be of a transmissive type (e.g. employing a transmissive mask).

The illuminator IL receives a beam of radiation from a radiation source SO. The source and the lithographic apparatus may be separate entities, for example, when the source is a plasma discharge source. In such cases, the source is not considered to form part of the lithographic apparatus and the radiation beam is generally passed from the source SO to the illuminator IL with the aid of a radiation collector comprising, for example, suitable collecting mirrors and/or a spectral purity filter. In other cases, the source may be integral part of the apparatus, for example, when the source is a mercury lamp. The source SO and the illuminator IL, may be referred to as a radiation system.

The illuminator IL may comprise an adjusting device for adjusting the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation, referred to as the projection beam PB, having a desired uniformity and intensity distribution in its cross-section.

The projection beam PB is incident on the mask MA, which is held on the mask table MT. Being reflected by the mask MA, the projection beam PB passes through the lens PL, which focuses the beam onto a target portion C of the substrate W. With the aid of the second positioning device PW and position sensor IF2 (e.g. an interferometric device), the substrate table WT can be moved accurately, e.g. so as to position different target portions C in the path of the beam PB. Similarly, the first positioning device PM and position sensor IF1 can be used to accurately position the mask MA with respect to the path of the beam PB, e.g., after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.
3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

Figure 2:
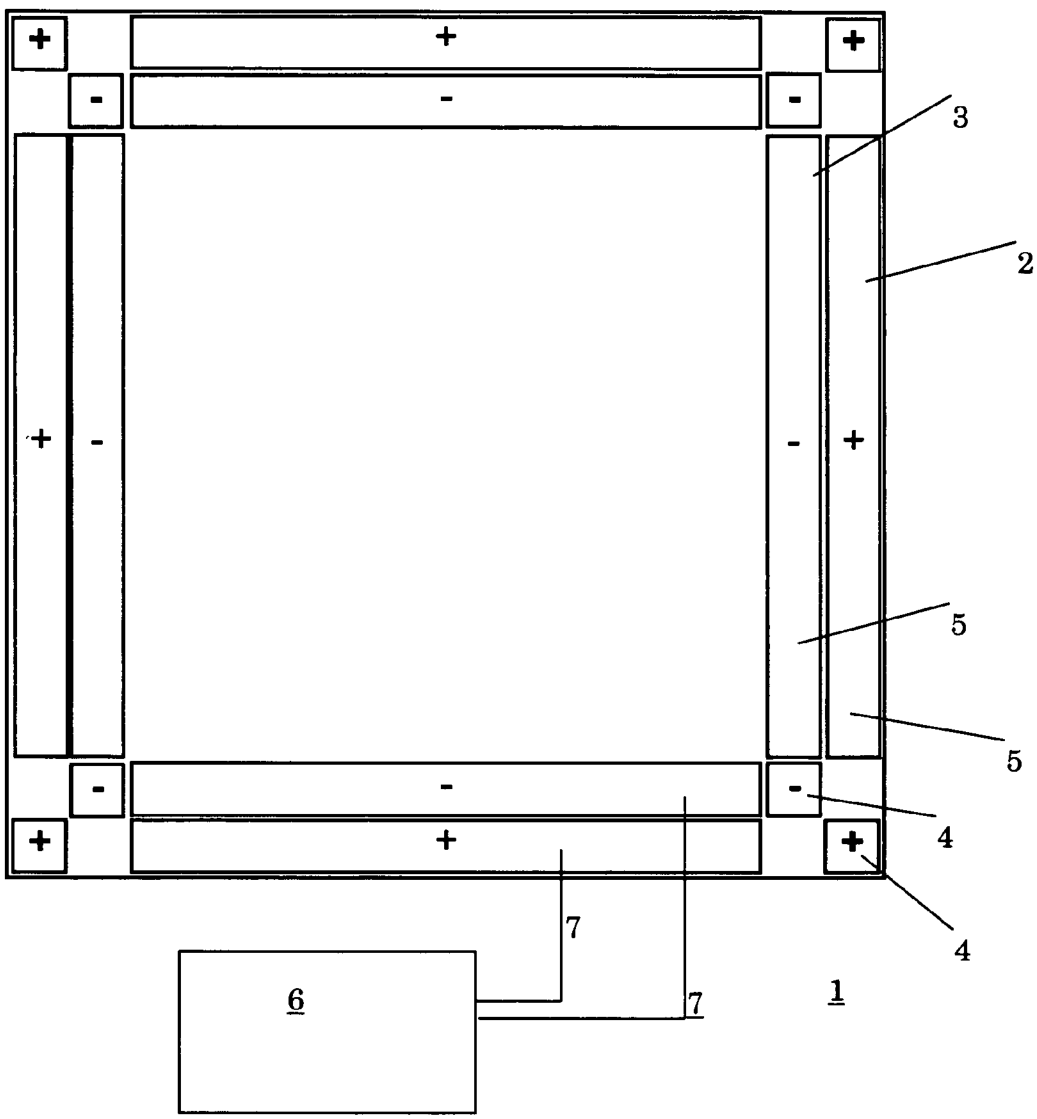
FIG. 2 depicts a first embodiment of a reticle holder depicted in FIG. 1.

FIG. 2 shows a first embodiment of the invention, showing a reticle support 1 for supporting a reticle (not shown) in the lithographic apparatus of FIG. 1. In FIG. 2, the reticle support is provided with a plurality of zones 2 and 3 generally located around a circumference of the reticle support 1 for creating a locally adjusted pressure. The term "circumference" as used herein is not limited to circular configurations, but can apply to any shape and can also be considered to be a "peripheral" portion. More particularly, the reticle support 1 comprises an outer circumference of pulling pads 2, indicated by a plus (+) sign, and an inner circumference, adjacent to the outer circumference of the pulling pads 2 of pushing pads 3, indicated by a minus (−) sign. Through the presence of the adjacent pulling and pushing pads 2 and 3, a local bending moment is provided near the edges the reticle. In this way, as will become clear with reference to FIG. 6, an unflatness of the reticle may be eliminated and improved flatness may be attained. Such an unflatness may be caused by interlaminar stress that is present in the reticle, in particular, for a reticle, which is comprised of a plurality of reflective layers that are bonded together. Specific dimensions through which the reticle is clamped is a total area of 150×150 mm, corner pads 4 of 10×10 mm and two adjacent elongated side pads 5 of 10×130 mm alternate for pulling and pushing the reticle so as to provide a local bending moment for locally bending the reticle near the outer edge of the reticle. The pulling pressure ranged from 0.15 to 3 bar. Schematically, a control unit 6 is illustrated that controls the pads 2, 3 in order to provide the locally adjusted control through signal lines 7.

In FIG. 2, an illustration is provided for creating a bending moment near the edges of the reticle to attain a level reticle. In addition to this, a preferably uniform supporting pressure may be provided to physically support the reticle.

Figure 3:
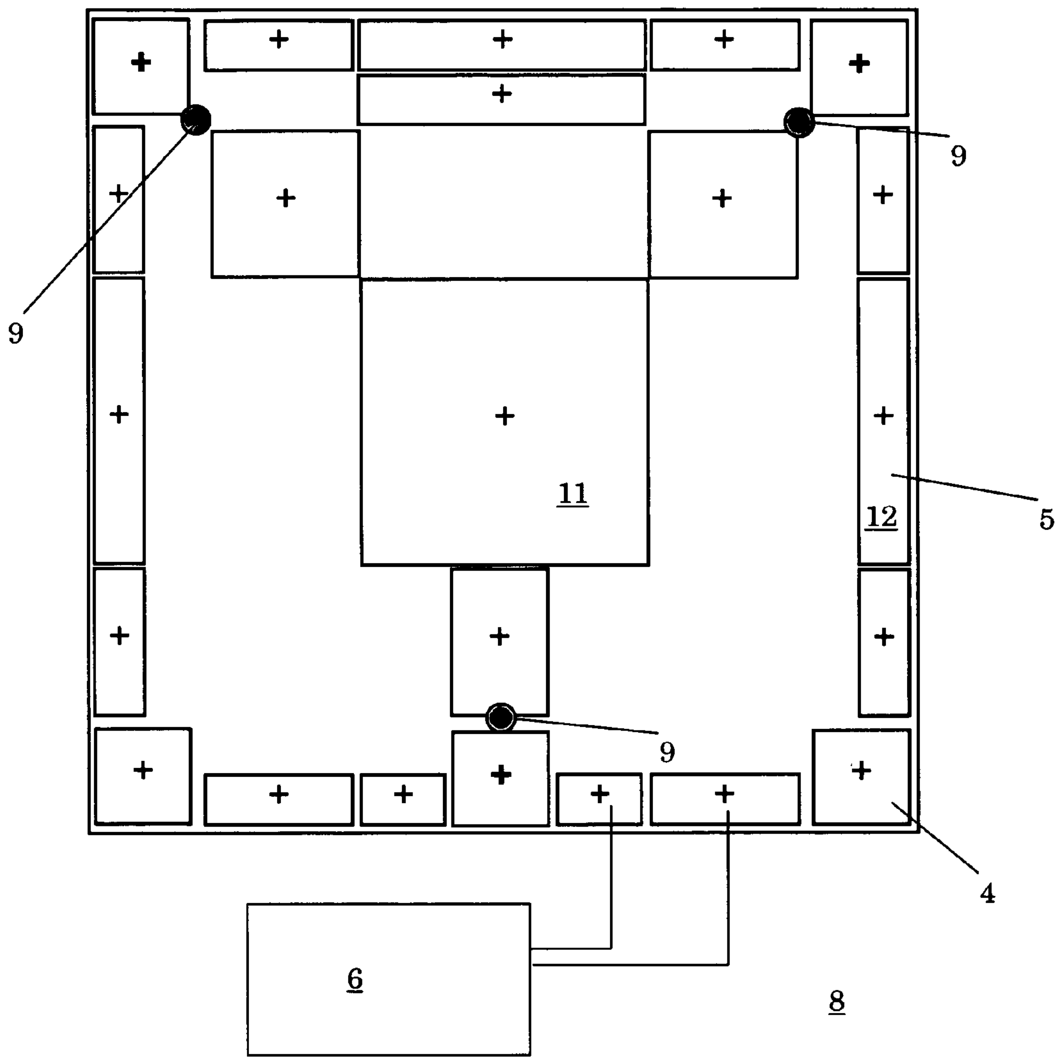
FIG. 3 depicts a second embodiment of the reticle holder depicted in FIG. 1.

FIG. 3 shows a three point suspension of a reticle clamp 8 that is designed according to the invention. The three support points 9 are the only physical contacts and, therefore, the only points where, due to the presence of particles, unevenness can be obtained. Such unevenness amounts to a tilt of the reticle, however, that can be optically neutralized using conventional methods, and is not harmful for image resolution.

Figure 4:
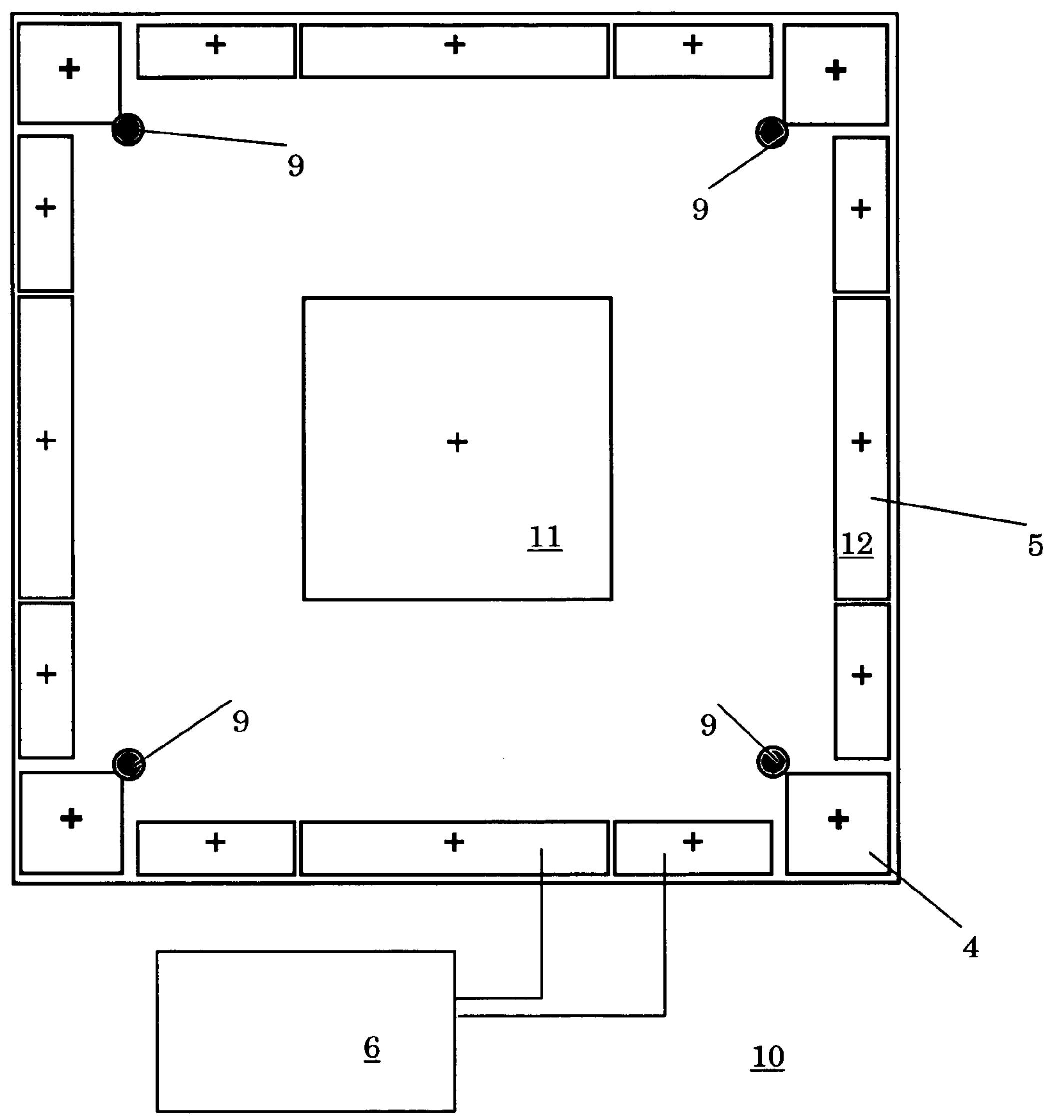
FIG. 4 depicts a third embodiment of the reticle holder depicted in FIG. 1.

FIG. 4 shows a four point suspension of a reticle clamp 10 that is designed according to an embodiment of the invention. The torsion and tilt due to the presence of a particle on one of the supports 9 can be optically neutralized using conventional methods. The three-point and four-point suspension configurations of FIG. 3 and FIG. 4 are characterized by central pulling pads 11 that create, in combination with the suspension points 9 and the peripheral pulling pads 12, a bending moment near the edges, as well as a supporting force for the article.

Figure 5:
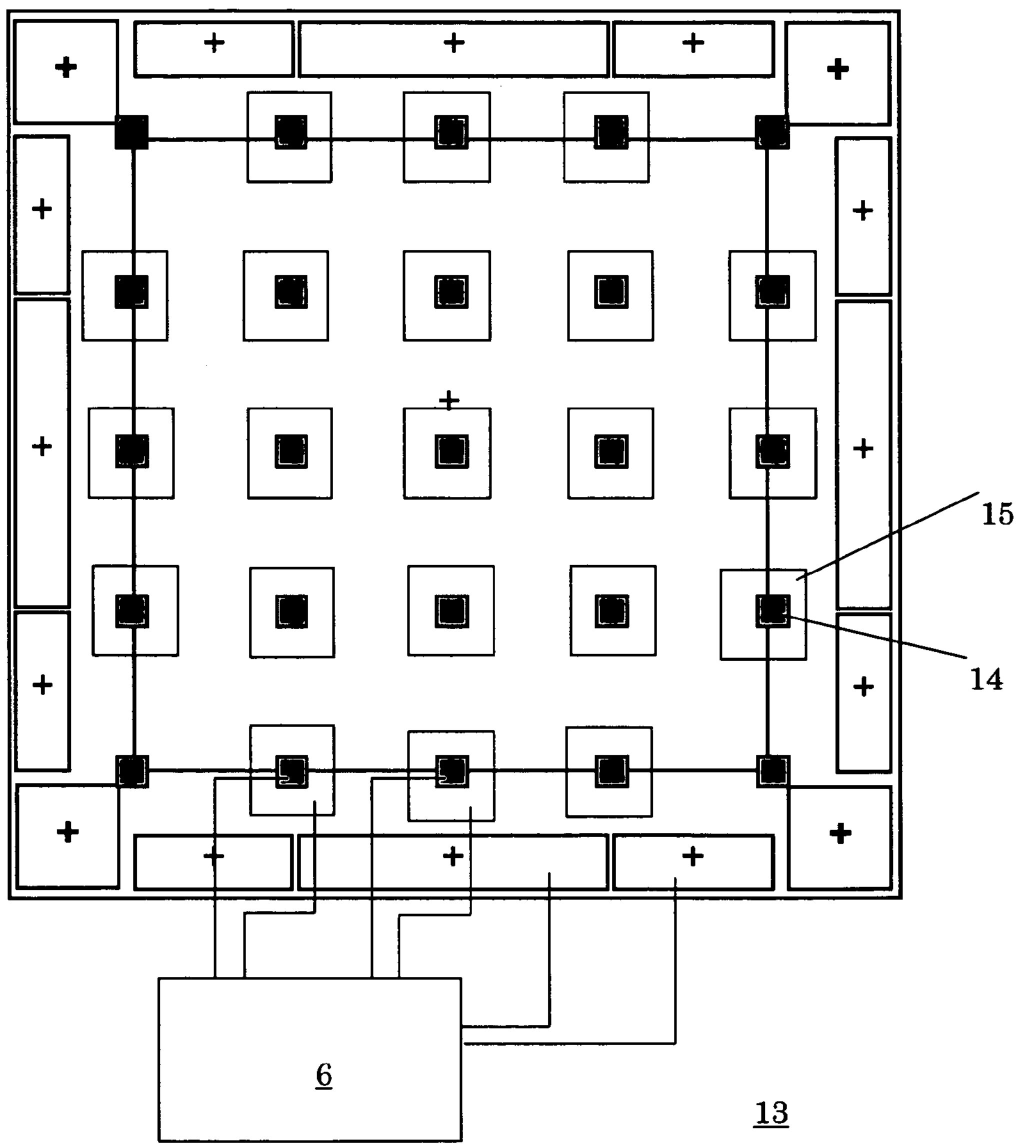
FIG. 5 depicts a fourth embodiment of the reticle holder depicted in FIG. 1.

FIG. 5 shows another embodiment of the invention. In this embodiment, the clamp 13 comprises a plurality of centrally positioned active supports 14, for example, in the form a piezo pad. These active supports 14 are located central to an electrode 15, which may form an electrostatic height sensor in combination with the reticle placed on the support 1. In this way, a height detection is obtained locally around the supports. In response thereto, the control unit 6 controls the active supports 14 to provide an increased or decreased pressure so that the pressure is locally adjusted in response to detected height variations. In this way, the presence of an impurity particle on a support distorting the levelness of the reticle may be corrected by lowering the local pressure of that support (and possibly surrounding supports) where the presence, through a locally increased detected height, is detected.

In one embodiment, the specific dimensions for features depicted in FIG. 3–FIG. 5 include elongated side pads 5 having a width of 10 mm and square corner pads 4 having a width of 20 mm. Central pads 11 are provided with an active pulling area ranging from 3–30 $cm^2$. The pulling pressure ranged from 0.15 to 3 bar.

Figure 6:
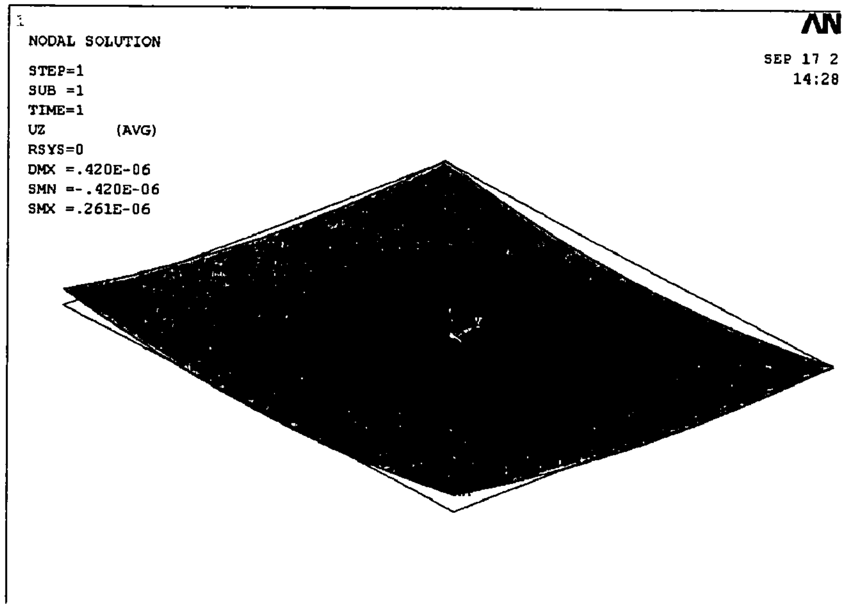
FIG. 6 depicts a height map of a 150×150 mm reticle having a 2 micron height deflection.

FIG. 6 shows a height map of an unclamped reticle. The reticle comprises multiple reflective layers. Due to the presence of the multilayers, laminar stress is present. These stresses may vary from −100 MPa to +500 MPa and may result in an imperfection up to 2 microns. Generally, the reticle assumes, in a situation of homogenic laminar stress, the shape of a sphere. In the shown embodiment, a stress of 400 MPa results in an upward incline towards the edges of the reticle.

Figure 7:
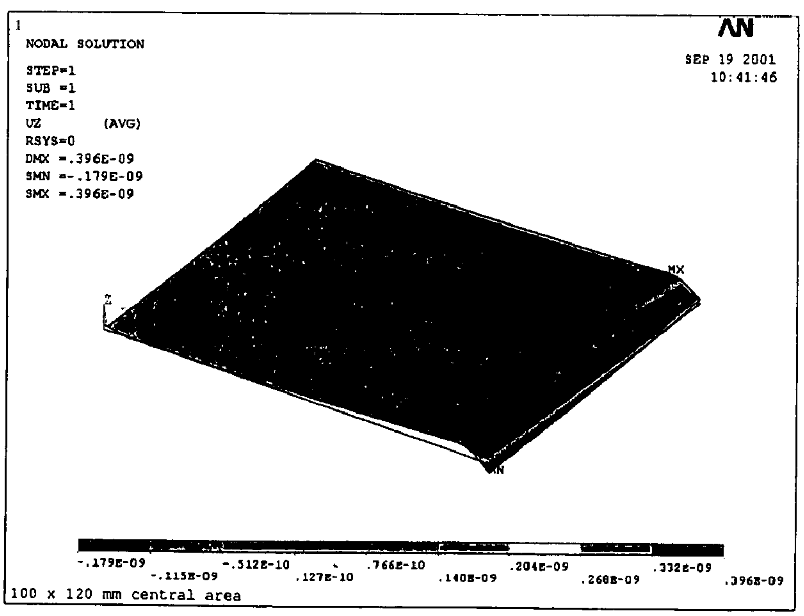
FIG. 7 depicts the height map of a quarter of a central 100×120 mm quality area of the reticle of FIG. 6 when clamped by the embodiment of FIG. 2.

FIG. 7 depicts the height map of a quarter of a central 100×120 mm quality area of the reticle of FIG. 6 when clamped by the embodiment of FIG. 2. Generally, for a 150×150 mm reticle piece, only a central part (called a quality area) of which is used for illumination purposes. An area in the direct vicinity of the quality area is used for alignment and detection purposes. As a practical example, the central quality area is a 100×100 mm area, and the alignment area resides on opposite sides of the quality area in a 10×100 mm strips. FIG. 7 shows a quarter of such an alignment area of 100×120 mm, seen from the center of the reticle (a 50×60 mm area). As can be seen from the height map, the maximal deflection is 0.5 nm in the quality area and the alignment area. The local tilt corresponding to the height map is maximally 0.1 μrad. The above mentioned maximum values are well within specs for attaining a 1 nm contribution to an overlay error on wafer level.

Figure 8:
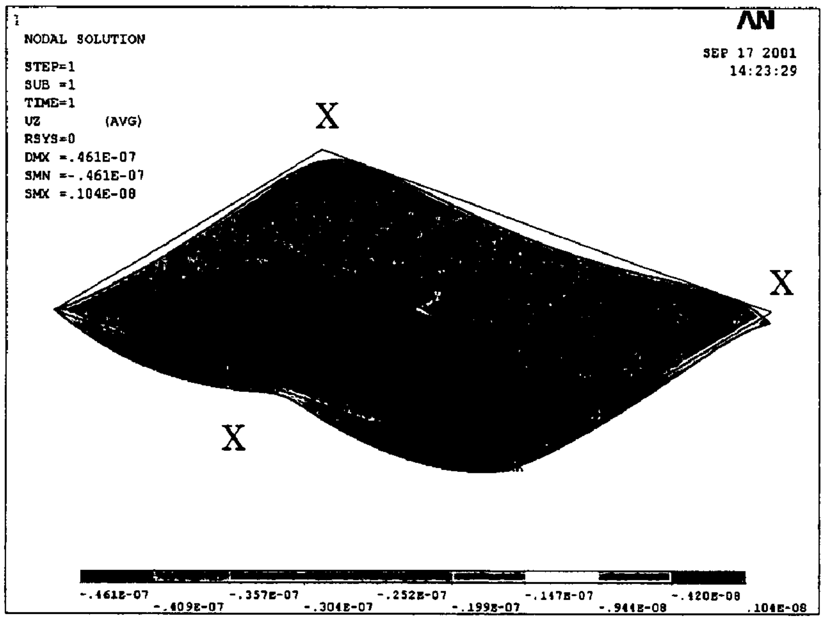
FIG. 8 depicts the height map of the central 100×120 mm quality area of the reticle of FIG. 6 when clamped by the embodiment of FIG. 3.

FIG. 8 depicts the height map of the central 100×120 mm quality area of the reticle of FIG. 6 when clamped by the tripod embodiment of FIG. 3. As shown, the supports are just outside the clamping area on 55×55 mm measured from a central position (as indicated by the three X-s). It can be seen that the deflection is reduced from 2 microns to 50 nm, where a corresponding maximal rotation amounts to 4 μrad.

Figure 9:
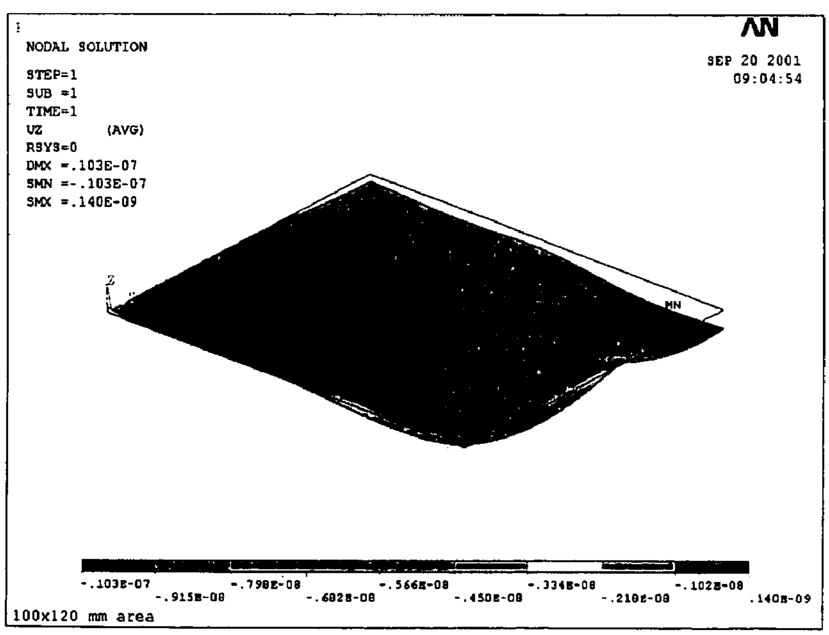
FIG. 9 depicts the height map of a quarter of the central 100×120 mm quality area of the reticle of FIG. 6 when clamped by the embodiment of FIG. 5.

The height map of FIG. 9 corresponds to a quarter of the central 100×120 mm quality area of the reticle of FIG. 6 when clamped by the embodiment of FIG. 5. Here, the height map is well within the specification for attaining the above mentioned 1 nm overlay error; the maximal height variation is 11 nm and local tilt amounts to 0.4 μrad in the central quality area, whereas it amounts to 0.7 μrad in the detection/alignment area.

Although the shown embodiments are based on electrostatic attraction and/or repulsion, embodiments of the invention are not limited thereto, and may also use other forms of pressure. For example, the pushing and pulling zones 2, 3 indicated in FIGS. 2–5 may comprise sectioned pressure zones for creating a relatively differing backfill gas pressure. It may also be feasible that a combination of a homogenous electrostatic pressure, in combination with such sectioned pressure zones, may be used. In such an embodiment, the homogenous pressure is large enough to create a positive resultant downward force for the reticle. For such an embodiment, the force may locally be varied by varying the local backfill pressure.

The embodiments illustrated are for a reflective reticle for use in a vacuum lithographic environment. However, embodiments of the invention may also be applied to other articles to be placed in a beam path of the projection beam of radiation, such as a transmissive article clamped on the side or a substrate to be irradiated or a wafer or the like.

While specific embodiments of the invention have been described above, it will be appreciated that the invention may be practiced otherwise than as described. The description is not intended to limit the invention.

What is claimed is:

1. A lithographic projection apparatus comprising:

an illumination system to provide a beam of radiation;

an article support to support an article having at least one edge to be placed in a beam path of said beam of radiation; and a clamp to clamp said article to said article support, wherein said clamp is provided with a plurality of zones located substantially continuously around a circumference of said article support to create a locally adjusted pressure so as to provide a local bending moment near the edge of said article to locally bend said article.

2. A lithographic projection apparatus according to claim 1, wherein said article support comprises at least three support pillars.

3. A lithographic apparatus according to claim 2, wherein said article support consists of three pillars.

4. A lithographic apparatus according to claim 2, wherein said article support consists of four support pillars.

5. A lithographic apparatus according to claim 2, wherein said support pillars are actuable.

6. A lithographic apparatus according to claim 5, wherein said support pillars are piezo-pads.

7. A lithographic apparatus according to claim 1, wherein at least one of said plurality of zones comprises an individually controllable clamp.

8. A lithographic apparatus according to claim 7, wherein said clamp comprises a height sensor to sense a local height of the article.

9. A lithographic apparatus according to claim 1, further comprising a clamp control unit to adjust the clamping pressure of said plurality of zones to attain a leveled article.

10. A lithographic apparatus according to claim 9, wherein said clamp control unit is configured to control said clamping pressure in response to at least one of a detected local height of said article and a detected image quality.

11. A lithographic apparatus according to claim 1, wherein said plurality of zones comprise sectioned pressure zones to create a relatively differing backfill gas pressure.

12. A lithographic apparatus according to claim 1, wherein said article comprises a reticle.

13. An article support to support a flat article having at least one edge to be placed in a beam path of radiation, said article support comprising:

a clamp to clamp said article to said article support, wherein said clamp is provided with a plurality of zones located substantially continuously around a circumference of said article support to create a locally adjusted pressure so as to provide a local bending moment near the edge of said article to locally bend said article.

* * * * *